(12) United States Patent
Naka et al.

(10) Patent No.: US 12,036,798 B2
(45) Date of Patent: Jul. 16, 2024

(54) CONTROL DEVICE AND METHOD FOR CONTROLLING ELEMENT SUBSTRATE

(71) Applicant: CANON KABUSHIKI KAISHA, Tokyo (JP)

(72) Inventors: Hironori Naka, Tokyo (JP); Kazuki Hirobe, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 197 days.

(21) Appl. No.: 17/693,128

(22) Filed: Mar. 11, 2022

(65) Prior Publication Data
US 2022/0288929 A1  Sep. 15, 2022

(30) Foreign Application Priority Data
Mar. 15, 2021 (JP) ................................ 2021-040994

(51) Int. Cl.
*B41J 2/175* (2006.01)
*G11C 17/16* (2006.01)

(52) U.S. Cl.
CPC ........... *B41J 2/17546* (2013.01); *G11C 17/16* (2013.01); *B41J 2202/17* (2013.01)

(58) Field of Classification Search
CPC .... B41J 2/17546; B41J 2202/17; G11C 17/16
See application file for complete search history.

(56) References Cited

U.S. PATENT DOCUMENTS 6,435,676 B1 *  8/2002  Murray ................ B41J 2/17566
                                                             347/86
2017/0221574 A1 *  8/2017  Kim ........................ H01L 28/00

FOREIGN PATENT DOCUMENTS

JP  2006015736 A  1/2006

* cited by examiner

*Primary Examiner* — Julian D Huffman
(74) *Attorney, Agent, or Firm* — Canon U.S.A., Inc. IP Division

(57) ABSTRACT

An element substrate is provided with a fuse memory configured to store information in response to having a voltage applied thereto, a first switch configured to switch whether or not to energize the fuse memory, a resistance element, a second switch configured to switch whether or not to energize the resistance element, a first node connected to the fuse memory and the resistance element, and a second node configured to supply power to the first node from outside. Regarding the element substrate, electric charge that remains at the first node is discharged by allowing, before allowing the first switch to energize the fuse memory, the second switch to energize the resistance element from the first node.

8 Claims, 4 Drawing Sheets

CONTROL DEVICE AND METHOD FOR CONTROLLING ELEMENT SUBSTRATE

BACKGROUND OF THE DISCLOSURE

Field of the Disclosure

The present disclosure relates to a control device and a method for controlling an element substrate.

Description of the Related Art

As disclosed in Japanese Patent Laid-Open No. 2006-15736, a print head of an inkjet printing apparatus has, in addition to a heater for discharging ink, an element substrate provided with a fuse as a memory for holding information regarding the print head.

However, depending on the configuration of the memory mounted on the element substrate, it is conceivable that unintentional access to the memory may occur due to residual charge. In that case, there is concern that information cannot be appropriately stored.

SUMMARY OF THE DISCLOSURE

The present disclosure can cause an element substrate to store information appropriately.

Aspects of the present disclosure are related to a control device including an element substrate and a controller. The element substrate is provided with a fuse memory configured to store information in response to having a voltage applied thereto, a first switch configured to switch whether or not to energize the fuse memory, a resistance element, a second switch configured to switch whether or not to energize the resistance element, a first node connected to the fuse memory and the resistance element, and a second node configured to supply power to the first node from outside. The controller is configured to switch the first switch, store information into the fuse memory, and read out information from the fuse memory. Before allowing the first switch to energize the fuse memory, the controller causes electric charge that remains at the first node to be discharged by allowing the second switch to energize the resistance element from the first node.

Further features of the present disclosure will become apparent from the following description of exemplary embodiments with reference to the attached drawings.

DESCRIPTION OF THE EMBODIMENTS

In the following, an embodiment of the present disclosure will be described in detail with reference to the drawings.

Figure 1:
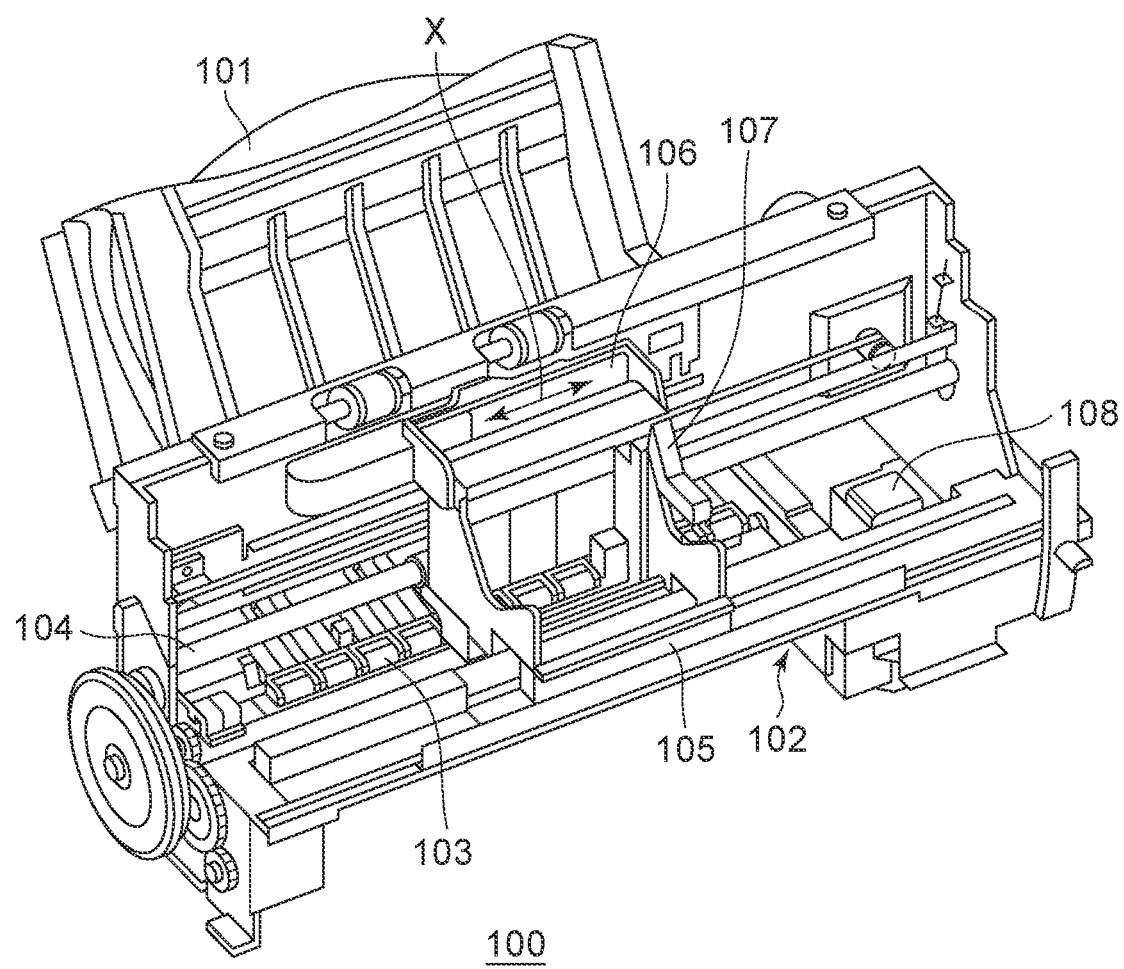
FIG. 1 is a perspective view mainly illustrating a schematic configuration of a print unit of an image printing apparatus according to an embodiment.

FIG. 1 is a perspective view of the configuration of the inside of an inkjet printing apparatus according to the embodiment. In FIG. 1, an inkjet printing apparatus 100 includes an automatic feeding unit 101, a conveyance unit 103, and a recovery unit 108. The automatic feeding unit 101 automatically feeds recording media such as paper into the main body of the inkjet printing apparatus 100. The conveyance unit 103 guides recording media sent one at a time from the automatic feeding unit 101 to a certain printing position using a roller and also guides each recording medium from the printing position to a discharging unit 102.

The recovery unit 108 performs recovery processing on a print unit that performs desired printing on the recording medium conveyed to the printing position. The print unit includes a carriage 105 and a print head 201. The carriage 105 is held by a carriage shaft 104 so as to be movable in main scanning directions represented by an arrow X. The print head 201 is installed in the carriage 105 so as to be detachable from the carriage 105.

The carriage 105 has a carriage cover 106 and a head set lever 107. The carriage cover 106 engages with the carriage 105 and is used to guide the print head 201 to a certain mounting position on the carriage 105. The head set lever 107 engages with a tank holder of the print head 201 and presses the print head 201 such that the print head 201 is set at the certain mounting position.

A head set plate (not illustrated) is provided above the carriage 105 so as to be rotatable about a head set lever shaft, and is spring urged by a portion engaging with the print head 201. The head set lever 107 is configured to mount the print head 201 onto the carriage 105 while pressing the print head 201 with the spring force.

Figure 2:
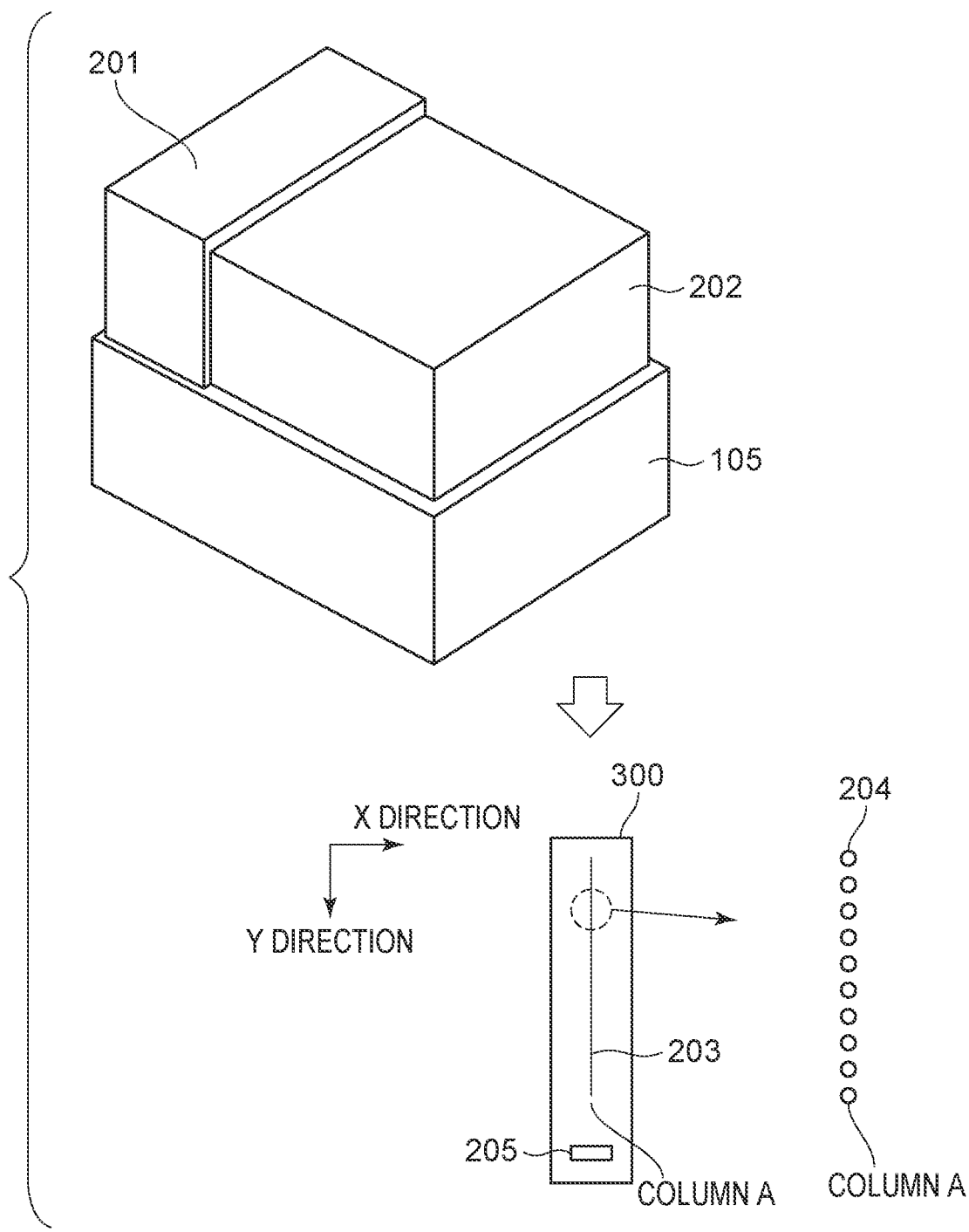
FIG. 2 is a diagram for describing a print head according to the present embodiment.

FIG. 2 is a diagram for describing the print head 201 according to the present embodiment. The print head 201 engages with the carriage 105 to perform printing. The print head 201 is used in the form of a unit having printing element columns corresponding to respective liquid inks stored in an ink cartridge 202. The ink cartridge 202 stores inks such as black (Bk), cyan (C), magenta (M), and yellow (Y) separately from each other, and has containers corresponding to the respective colors and formed so as to be integrated with each other.

The print head 201 according to the present embodiment has, on the side facing the recording medium, printing element columns 203 corresponding to the respective colors described above on a one-to-one basis (a column A in FIG. 2). In FIG. 2, for convenience' sake, only a printing element column corresponding to one of the colors is illustrated. The printing element columns 203 are provided on a printing element substrate of the print head 201, the printing element substrate being formed of a material such as silicon. The X direction in FIG. 2 is a "main scanning direction", which is the same as one of the directions represented by the arrow X in FIG. 1. The Y direction is a "sub-scanning direction" crossing the X direction, and is a direction in which the conveyance unit 103 in FIG. 1 conveys recording media. Each printing element column 203 has a plurality of printing elements 204 aligned in the Y direction. The printing elements 204 serve as elements that generate energy used to discharge liquid. The printing elements 204 are electro-thermal converters and are aligned along the Y direction. Bubbles are caused in ink using heat generated by the electro-thermal converters, and ink is discharged from discharge ports corresponding to the printing elements 204 onto the recording medium. Each printing element column 203 of the print head 201 is used to perform printing for one color component. The print head 201 performs printing onto the recording medium by discharging ink in accordance with the timing of movement while moving in the X direction.

Figure 3:
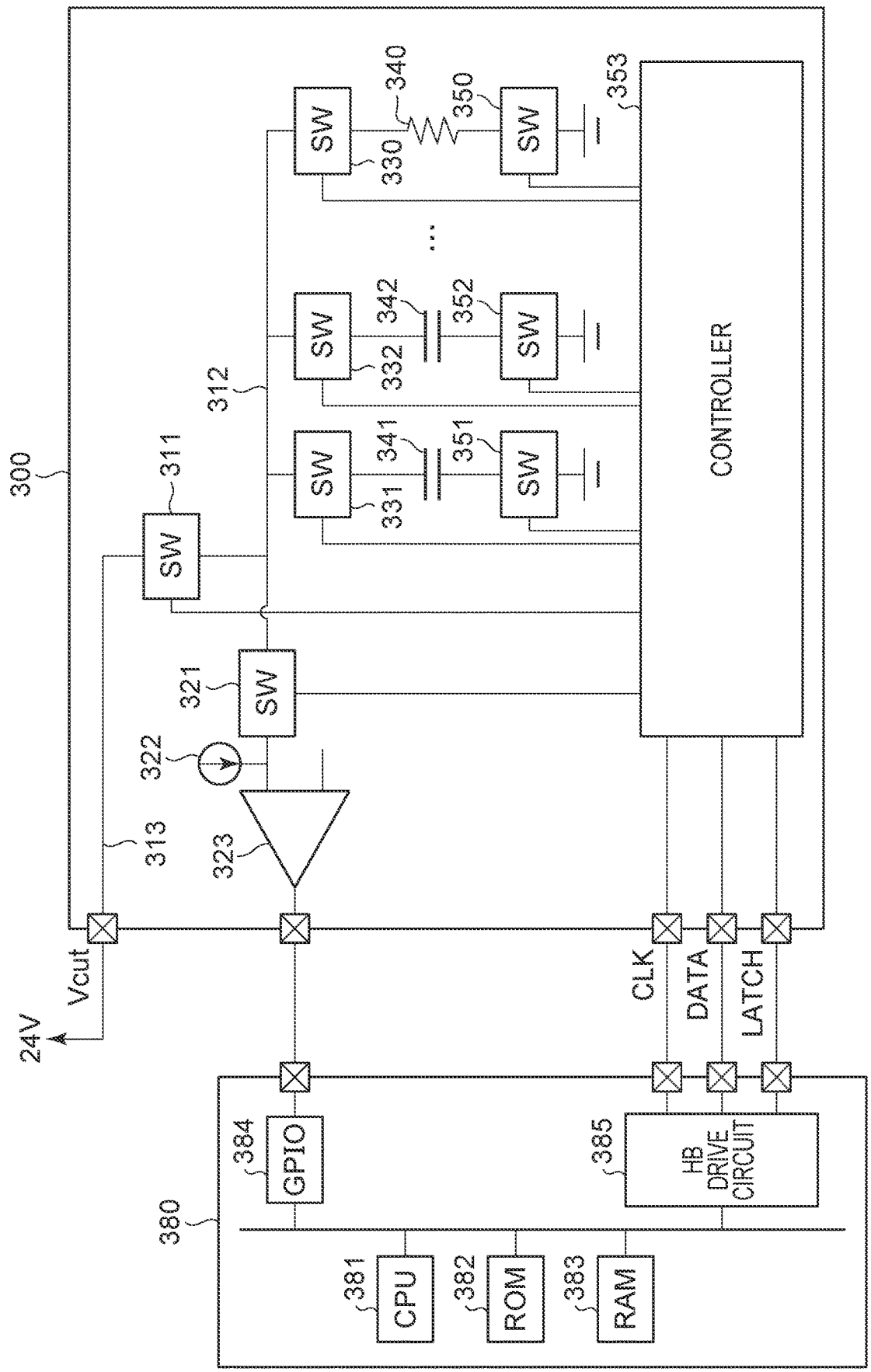
FIG. 3 is a block diagram illustrating the configuration of the printing apparatus according to the embodiment.

FIG. 3 is a block diagram illustrating electrical configurations of the inkjet printing apparatus and the print head according to the embodiment. A main controller 380, which is a controller of the inkjet printing apparatus 100, includes a central processing unit (CPU) 381, a random access memory (RAM) 383, and various circuits and interfaces. The CPU 381 executes a program read from a read-only memory (ROM) 382. The RAM 383 temporarily stores information. From a Heater Board (HB) drive circuit 385, a clock signal (CLK), a data signal (DATA), and a latch signal (LATCH) are sent to a main controller 353 of a printing element substrate 300 via a connection unit. The clock signal (CLK) is used to drive circuits and elements provided on the printing element substrate 300. An antifuse to be described below can also operate using these signals. Moreover, these signals include a signal generated by the printing apparatus on the basis of input image data and used to drive the printing elements 204. The printing element substrate 300 receives a power supply voltage of 24 V from the inkjet printing apparatus 100 via a terminal. Furthermore, as will be described later, the inkjet printing apparatus 100 also serves as a device that controls the printing element substrate 300, and causes the printing element substrate 300 to perform a write operation and a read operation. In the write operation, an antifuse is caused to store information. In the read operation, the stored information is read out.

Note that the printing element substrate 300 is provided with the printing elements described above with reference to FIG. 2; however, illustration of the printing elements is omitted in FIG. 3.

Moreover, antifuses are mounted as fuse memories on the printing element substrate 300 of the print head 201. The antifuses are realized by capacitive elements. Antifuses 341 and 342 are initially electrically open and have a substantially infinite resistance. The antifuses 341 and 342 are devices the resistances of which are reduced by having a voltage applied to the antifuses 341 and 342. An operation in which a voltage is applied to an antifuse to reduce its resistance value so to store information is referred to as a write operation. An operation in which the resistance value of an antifuse is confirmed so as to read out information is referred to as a read operation. Note that information that the antifuses are caused to store is information regarding, for example, the print head 201 and is used as a parameter for the inkjet printing apparatus 100 to control the print head 201.

For the antifuse 341, a switch (SW) 331 and a SW 351 are provided. For the antifuse 342, a SW 332 and a SW 352 are provided. These switches can be used to switch whether or not the antifuses can be energized.

When the read operation is to be performed on one of the antifuses, in response to a command from the CPU 381 included in the main controller 380 of the inkjet printing apparatus 100, serial communication to the controller 353 included in the print head 201 is performed using a serial communication signal generated by the HB drive circuit 385. Content received by the controller 353 includes information indicating that a read operation mode is to be started and information for selecting an antifuse to be subjected to the read operation. In a case where the selected antifuse is the antifuse 341, the CPU 381 switches on the SW 331 through serial communication. Next, the CPU 381 switches on the SW 351. In the present exemplary embodiment, at the time of the read operation mode, the DATA signal is connected to the SW 351. When a SW 321 is switched on in this state, electric charge is generated at a node 312, which is a wiring line from the SW 321 to the SW 331, the SW 332, . . . , due to a current from a constant current source 322. A comparator 323, which compares this electric charge with reference electric charge, outputs information regarding whether the resistance value of the selected antifuse 341 is greater or smaller than a reference resistance value. The CPU 381 included in the main controller 380 can acquire, as a binary value, the signal output from the comparator 323 via a general-purpose input/output (GPIO) 384, which is an output destination of and is connected to the comparator 323 by a signal line. After the read operation is completed, the CPU 381 performs serial communication to switch off the SW 351. Moreover, the CPU 381 performs serial communication to switch off the SW 331.

When the write operation is to be performed on one of the antifuses, serial communication from the main controller 380 to the controller 353 provided on the printing element substrate 300 is performed using a serial communication signal generated by the HB drive circuit 385. Content received by the controller 353 includes information indicating that a write operation mode is to be started and information for selecting an antifuse to be subjected to the write operation. In a case where the selected antifuse is the antifuse 342, the CPU 381 switches on the SW 332 using an antifuse selection signal. Next, by switching on a SW 311, the CPU 381 supplies power necessary for the write operation to the node 312 via a node 313 from outside the printing element substrate 300. When the SW 352 is switched on in a state in which power is supplied to the node 312, the resistance value of the antifuse 342 can be reduced. In the present embodiment, at the time of the write operation mode, the DATA signal is connected to the SW 352. In a case where it is less likely that the resistance value of the antifuse 342 reaches a desired resistance value after the SW 352 is switched on only one time, on-to-off and off-to-on operations are repeatedly performed on the SW 352 a plurality of times. After the write operation is completed, the CPU 381 switches off the SW 352. Moreover, the CPU 381 performs serial communication to switch off the SW 332.

Combinations each including an antifuse, a SW on the node side, and a SW on the controller side are arranged in addition to a combination of the antifuse 341, the SW 331 on the node side, and the SW 351 on the controller side and a combination of the antifuse 342, the SW 332 on the node side, and the SW 352 on the controller side.

A resistance element 340 is provided, which is connected to a SW 330 connected to the node 312 and is connected to a SW 350 on the controller side. The resistance element 340 is used to discharge electric charge of the node 312. The SW 350 is also connected to ground. Note that the resistance element 340 is also used in measurement for examining the resistance values of other resistance elements provided on the printing element substrate 300.

Figure 4:
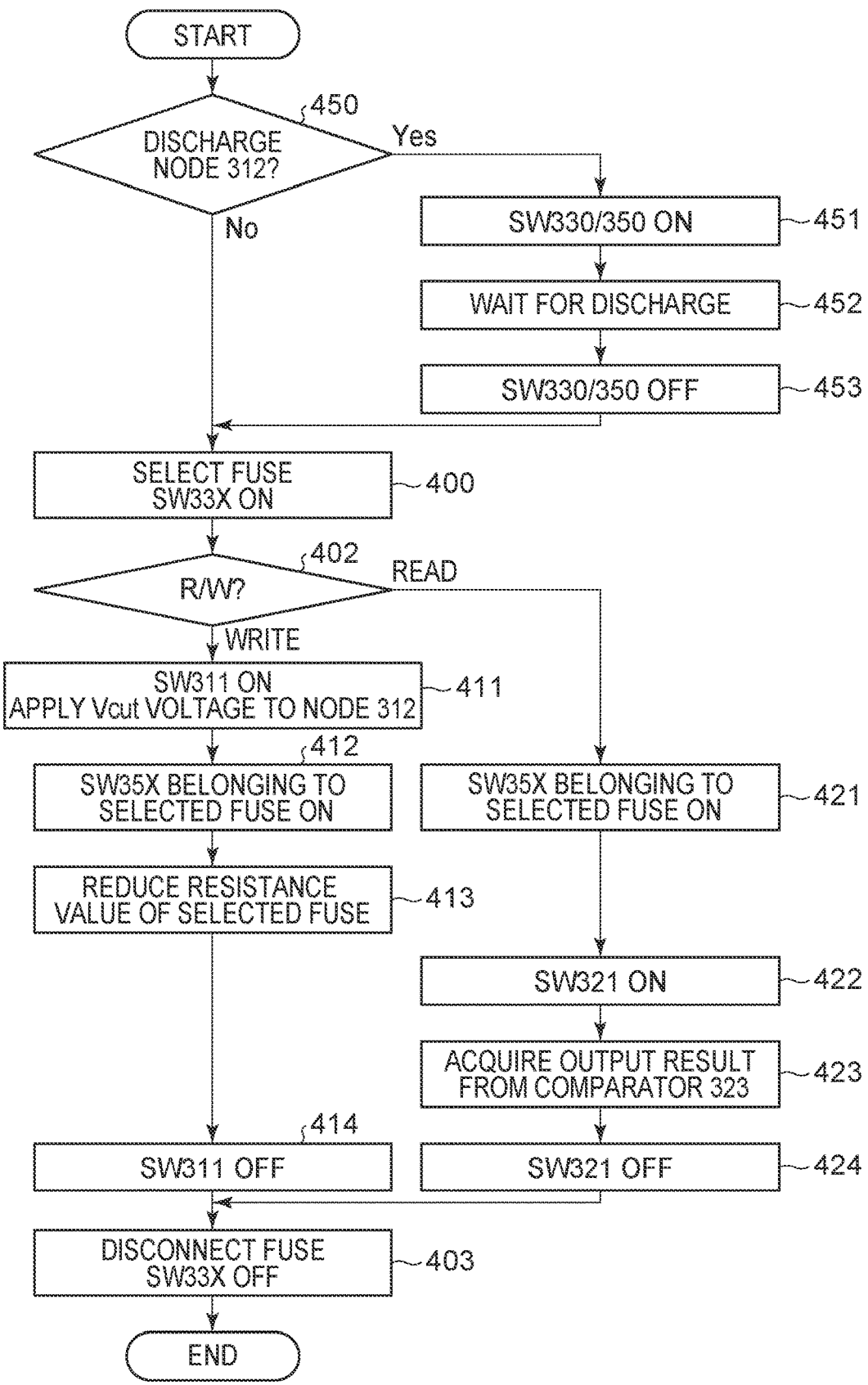
FIG. 4 is a flow chart illustrating the procedure of control processing according to the embodiment.

FIG. 4 illustrates a flow chart illustrating the procedure of processing in the read operation and the write operation using the inkjet printing apparatus according to the embodiment illustrated in FIG. 3. Hereinafter, description will be made with reference to FIGS. 3 and 4. The processing illustrated in FIG. 4 is set to be executed at a certain timing. For example, the processing is performed when the inkjet printing apparatus 100, which is not connected to a power supply, is connected to an AC power supply and also at a timing at which access to one of the antifuses needs to be made after the inkjet printing apparatus 100 is connected to the power supply.

First, in step 450 illustrated in FIG. 4, the CPU 381 determines whether or not to discharge the node 312. Step 450 is performed, for example, when the inkjet printing apparatus 100 is connected to an AC power supply for the first time. In this case, the CPU 381 determines that the node 312 is to be discharged, and Yes is obtained. In contrast, in a case where access to any one of the antifuses has been made a plurality of times after the inkjet printing apparatus 100 is connected to the AC power supply, and the CPU 381 determines that the node 312 does not need to be discharged, the process proceeds to step 400.

In a case where Yes is obtained in step 450, the process proceeds to step 451, and the CPU 381 switches on the SW 330 and the SW 350. As a result, the electric charge of the node 312 is discharged by the effect of the resistance element 340. The electric charge of the node is not output to outside the printing element substrate 300, and thus, for example, when power supply to the printing apparatus is blocked in a state where a voltage is applied to the node 312 from the power supply, the electric charge of the node 312 is not consumed and stays there as residual charge. However, in a case where the electric charge of the node 312 is discharged in this manner, this can help to prevent, for example, the residual charge of the node 312 from flowing into the selected antifuse 341 and unintentionally executing the write operation when the SW 331 and the SW 351 are switched on.

Next, the process proceeds to step 452, and the inkjet printing apparatus 100 waits for a predetermined time since it takes time to discharge the electric charge of the node 312 due to parasitic capacitance and the resistance value of the resistance element 340.

Next, in step 453, the CPU 381 switches off the SW 330 and the SW 350.

Through the operation described above, the discharge of the node 312 is completed, the potential of the node 312 can be made equal to ground, and the inkjet printing apparatus 100 can be reset to its initial state.

In steps 400 and 402, in response to a command from the CPU 381 included in the main controller 380, serial communication to the controller 353 provided on the printing element substrate 300 is performed using a serial communication signal generated by the HB drive circuit 385. Content received by the controller 353 includes information indicating that the read operation mode is to be started and information for selecting an antifuse to be subjected to the read operation. The CPU 381 selects an antifuse in this manner and switches on a SW 33X (X is an integer) connected to the selected fuse. In this case, suppose that the selected antifuse is the antifuse 341, and the CPU 381 switches on the SW 331 through serial communication (step 400). Furthermore, as described above, the CPU 381 selects the read operation mode and sends content to the controller 353, the content including information indicating that the read operation mode is to be started (step 402).

In the case of the read operation, the process proceeds to step 421, and then the CPU 381 switches on the SW 35X (X is an integer), which is the SW 351 in this case. In the present embodiment, the DATA signal is connected to the SW 351 at the time of the read operation mode.

Next, when the SW 321 is switched on in step 422, electric charge is generated at the node 312, which is a wiring line from the SW 321 to the SW 331, the SW 332, . . . , due to an electric current from the constant current source 322.

In step 423, the comparator 323, which compares the electric charge of the node 312 with reference electric charge, outputs information regarding whether the resistance value of the selected antifuse 341 is greater or smaller than a reference resistance value. The CPU 381 included in the main controller 380 acquires, as a binary value, the signal (an output result) output from the comparator 323 via the GPIO 384, which is an output destination of and is connected to the comparator 323 by a signal line.

In step 424, the CPU 381 performs serial communication to switch off the SW 321.

In step 403, the CPU 381 performs serial communication again to switch off the SW 331.

Furthermore, the CPU 381 switches off the SW 351.

In a case where the CPU 381 selects the antifuse 342 in step 400 and selects the write operation in step 402, the CPU 381 performs serial communication to the controller 353 provided on the printing element substrate 300 using a serial communication signal generated by the HB drive circuit 385. Content received by the controller 353 includes information indicating that the write operation mode is to be started and information for selecting an antifuse to be subjected to the write operation. In a case where the selected antifuse is the antifuse 342, the SW 332 is switched on based on antifuse selection information from the CPU 381.

In step 411, by switching on the SW 311, the CPU 381 applies a voltage Vcut necessary for the write operation to the node 312.

Next, in step 412, the CPU 381 switches on the SW 352.

In step 413, the resistance value of the antifuse 342 is reduced. In following step 414, the CPU 381 performs serial communication to switch off the SW 311.

Next, in step 403, the SW 332 is switched off.

According to the embodiment, it is less likely that unintentional access to a memory of an element substrate occurs due to residual charge, and information can be appropriately stored.

Other Embodiments

The embodiment of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment and/or that includes one or more circuits (e.g., application specific integrated circuit (ASIC)) for performing the functions of one or more of the above-described embodiment, and by a method performed by the computer of the system or apparatus by, for example, reading out and executing the computer executable instructions from the storage medium to perform the functions of one or more of the above-described embodiment and/or controlling the one or more circuits to perform the functions of one or more of the above-described embodiment. The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)), a flash memory device, a memory card, and the like.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of priority from Japanese Patent Application No. 2021-040994, filed Mar. 15, 2021, which is hereby incorporated by reference herein in its entirety.

What is claimed is:

1. A control device comprising:
an element substrate provided with a fuse memory configured to store information in response to having a voltage applied thereto, a first switch configured to switch whether or not to energize the fuse memory, a first node connected to the fuse memory through the first switch and to a comparator through a third switch, and a second node configured to supply power to the first node from outside;
a resistance element disposed on the element substrate between a second switch and a ground potential, the second switch connecting the resistance element to the first node; and
a controller configured to switch the first switch to store information into the fuse memory, and to read out information from the fuse memory, and to switch the second switch to connect the first node to the ground potential through the resistance element,
wherein, before allowing the first switch to energize the fuse memory, the controller causes electric charge that remains at the first node to be discharged by switching the second switch.

2. The control device according to claim 1, wherein the electric charge of the first node is not output to outside the element substrate.

3. The control device according to claim 1, wherein the element substrate is provided with a plurality of the fuse memories and a plurality of the first switches corresponding to the plurality of fuse memories.

4. The control device according to claim 1, wherein the resistance element is also used to measure resistance values of other resistance elements in the element substrate.

5. The control device according to claim 1, wherein the element substrate is provided so as to correspond to a liquid discharge port and is a printing element substrate provided with a printing element configured to generate energy to be used to discharge liquid.

6. The control device according to claim 5, wherein the controller sends a signal for driving the printing element to the printing element substrate, the signal being based on input image data.

7. The control device according to claim 1, wherein the controller switches the second switch, to discharge the electric charge remaining on the first node, in a case where the control device is initially powered on.

8. A method for controlling an element substrate provided with a fuse memory configured to store information in response to having a voltage applied thereto, a first switch configured to switch whether or not to energize the fuse memory, a first node connected to the fuse memory through the first switch and to a comparator through a third switch, and a second node configured to supply power to the first node from outside, and a resistance element disposed on the element substrate between a second switch and a ground potential, the second switch connecting the resistance element to the first node, the method comprising:
discharging, before allowing the first switch to energize the fuse memory, electric charge that remains at the first node by switching the second switch to connect the first node to the ground potential through the resistance element.

* * * * *